United States Patent [19]

Gonsiorawski et al.

[11] Patent Number: 5,074,920

[45] Date of Patent: Dec. 24, 1991

[54] PHOTOVOLTAIC CELLS WITH IMPROVED THERMAL STABILITY

[75] Inventors: Ronald C. Gonsiorawski, Danvers; Jeffrey T. Borenstein, Burlington; Michael J. Kardauskas, Billerica, all of Mass.

[73] Assignee: Mobil Solar Energy Corporation, Billerica, Mass.

[21] Appl. No.: 587,242

[22] Filed: Sep. 24, 1990

[51] Int. Cl.$^5$ .................. H01L 31/05; H01L 31/18
[52] U.S. Cl. ........................... 136/244; 136/256; 437/2; 437/180; 437/205; 437/209; 228/179
[58] Field of Search .............. 136/244, 256; 437/2-5, 437/180, 205, 209; 228/179, 223, 58, 904

[56] References Cited

U.S. PATENT DOCUMENTS

| | | | |
|---|---|---|---|
| 3,411,952 | 11/1968 | Ross et al. | 136/244 |
| 3,574,925 | 4/1971 | Schneider et al. | 228/180 R |
| 3,769,091 | 10/1973 | Leinkram et al. | 136/246 |
| 4,173,820 | 11/1979 | Mueller et al. | 437/2 |

OTHER PUBLICATIONS

E. J. Stofel et al, *Conference Record, 17th IEEE Photovoltaic Specialists Conference*, (1984), pp. 173–178.
J. Zhao et al, *Solar Cells*, vol. 28, pp. 193–197 (1990).
H. S. Rauschenbach, "Solar Cell Array Design Handbook", Van Nostrand Reinhold Co. (1980), p. 463.

*Primary Examiner*—Aaron Weisstuch
*Attorney, Agent, or Firm*—Pandiscio & Pandiscio

[57] ABSTRACT

Photovoltaic cells with silver-rich thick film electrical contacts and superior thermal aging properties are disclosed. Electrical wires are bonded to the silver-rich thick film contacts using a tin and silver solder paste comprising between about 96% tin/4% silver and 98% tin/2% silver. Solar cells having soldered connections incorporating the present invention exhibit the capabilty of withstanding temperatures in the range of 150° C. with little or no deterioration of the solder bonds for periods far longer than conventionally prepared cells.

13 Claims, No Drawings

PHOTOVOLTAIC CELLS WITH IMPROVED THERMAL STABILITY

BACKGROUND OF THE INVENTION

It is well-known in the art to provide photovoltaic cells for various uses, particularly in generating electricity from solar energy. Such cells are typically quite small and must be electrically connected in larger grids or modules for common electrical applications. The conventional procedure for producing such photovoltaic modules is to coat a portion of both sides of each photovoltaic cell with a conductive metal or metal alloy to form an electrical contact. Electrical wires are subsequently soldered to the electrical contacts of a group of such coated cells in order to form a larger, interconnected cell grid in which the cells are connected in series or parallel relationship. Thick film coatings comprised of (1) silver or silver alloys containing small amounts of glass or (2) aluminum are commonly used as the electrical contacts for photovoltaic cells. In some solar cell production methods, the rear contact of the solar cell is made of aluminum but has "windows" or openings that expose the underlying silicon. Those openings are filled with a silver/glass coating which bonds to the silicon substrate and makes electrical contact with the aluminum coating. The segments of silver coating that fill the windows are known as "soldering pads", since it is far easier and more beneficial to bond copper conductors to the soldering pads than it is to bond them directly to the aluminum layer.

In both manufacturing and in many common applications of photovoltaic modules, the cells are subjected to continuous high temperatures or else to thermal cycles at regular or irregular intervals. For example, in the ethylene vinyl acetate (EVA) lamination procedure that typically follows cell stringing (interconnecting) in the manufacture of multi-cell modules, the cells are subjected to temperatures as high as about 150° C. for about 45-60 minutes. When used in the production of solar energy, the cells will heat up during a cycle of exposure to sunlight and then cool down again to ambient temperatures at night. In other applications, the heating and cooling cycles may be much more frequent. Accordingly, an important characteristic of such cells is their ability to withstand thermal aging, particularly with respect to their solder connections.

Prior art photovoltaic cells incorporating silver thick film electrical contacts or solder pads and conventional electrical solders applied by conventional dip or wave soldering techniques commonly show poor mechanical reliability of their solder bonds when subjected to thermal aging. Specifically, the strength of bonds made to silver/glass thick films on silicon using 63% tin/37% lead or 62% tin/36% lead/2% silver solders degrades by more than 80% upon exposure to temperatures of 150° C. for one hour. Since exposure to such temperatures for such periods of time is typically required to bond the cells to glass to manufacture photovoltaic modules, the bonds in modules made with such solders are inherently weak. It is expected that further degradation in bond strength will continue at normal operating temperatures of photovoltaic modules. Stress testing of modules made in this manner indicate that their performance degrades relatively rapidly under conditions that produce mechanical loading on the module, including changes in temperature which can be expected to occur in typical applications.

The problem of thermal degradation of soldered thick film silver-bearing conductors in semiconductor devices has been reported and discussed in the literature. For example, in "Progress in and Technology of Low Cost Silver Containing Thick Film Conductors", by B. E. Taylor, J. J. Felten, and J. R. Larry, in Proceedings of the 30th Electronic Components Conference, New York, IEEE, 1980, pp. 149-166, the authors reported that such degradation on miniaturized and hybrid circuits on ceramic substrates can be reduced, in the case of silver/palladium thick films, by the use of 95% tin/5% silver solders instead of conventional tin/lead solders. But, because this solder has a particularly high melting point, its tin component tends to dissolve silver from the thick film during bond formation Accordingly, this procedure would not be useful for soldering thick films consisting of primarily silver, which are considerably less expensive than the silver/palladium thick films of the reference.

In a more recent reference, "The Thermal-Cycled Adhesion Strength of Soldered Thick Film Silver-Bearing Conductors", by C. R. S. Needes and J. P. Brown, in Proceedings of ISHM '89, ISHM, 1989, pp. 211-219, the authors concluded (at p. 215): "For the silver conductor, the best [thermal]results were obtained with [a solder of]10 Sn/88 Pb/2 Ag." FIG. VII at p. 215 of the ISHM reference clearly shows that, with silver thick films on alumina substrates, a solder comprising 10% tin, 88% lead and 2% silver demonstrated superior thermal-cycled adhesion strength as compared with a solder of 96% tin and 4% silver. The 96 Sn/4 Ag solder began to show a marked deterioration after fewer than 200 thermal cycles, whereas solder bonds prepared using the 10 Sn/88 Pb/2 Ag solder did not show significant deterioration until approximately 500-600 thermal cycles. Both of the foregoing references are incorporated herein by reference.

The literature in this field thus teaches away from the use of tin/silver solders containing predominant proportions of tin on silver or silver alloy thick film contacts or soldering pads for photovoltaic cells. The literature suggests that the problem may be caused, at least in part, by the tendency of the tin/silver solder to cause "leaching" or "scavenging" of silver, i.e. the dissolution of the silver thick film in the molten solder at elevated temperatures. The relatively high cost of silver as well as technical considerations make it impractical or uneconomical to use thicker silver films or solder with higher proportions of silver to try to overcome the leaching problem. As noted above, silver/palladium thick films are even more expensive than using silver alone. Moreover, the toxicity of lead limits the utility of the tin/lead/silver solders touted by the Needes and Brown reference cited above.

The literature in this field also suggests that the problem of thermal instability may be caused, at least in part, by the formation of intermetallic compounds between tin and silver because such compounds are known to be brittle and weak. These compounds can form not only while the solder is molten, but any time the solder is at an elevated temperature. Some formation of these compounds occurs slowly even at room temperature. It has been suggested that these intermetallic compounds are the result of tin from the solder diffusing through the glass and metal surface phases. These compounds, being brittle, cause the metallization to feral at low stress levels.

It is possible, of course, that both the silver scavenging and intermetallic compound mechanisms are involved in the thermal instability problem. This makes a solution to the problem even more difficult to predict because a solution to one of these mechanism may exacerbate the other.

For example, one researcher reported reducing the problem of intermetallic compound formation by using a high tin-bearing solder, such as 96% tin/4% silver. The explanation was that a 96 Sn/4 Ag solder has a melting point significantly higher than a solder consisting of 62 % tin, 36% lead, and 2% silver, resulting in bonding the tin more strongly to the solder and thereby reducing diffusion. On the other hand, data reported in the Needes and Brown reference cited above suggest that the high tin content and high melting point of a 96 Sn/4 Ag solder may lead to increased thermal degradation of solder bonds due to the silver scavenging mechanism. Accordingly, the prior art provides no clear solution to the problem of thermal aging of solder bonds to silver metallized photovoltaic cells.

These and other drawbacks of the prior art are overcome with the present invention.

OBJECTIVES OF THE INVENTION

It is a principal object of this invention to provide photovoltaic cells having superior thermal aging properties.

It is also an object of this invention to provide photovoltaic cells with silver thick films which are electrically interconnected using a tin/silver solder and which demonstrate superior resistance to thermal degradation.

A further object of this invention is to provide a method of soldering the silver thick film contacts of photovoltaic cells using a tin/silver solder without causing deterioration of the thick film-substrate bonds.

Still another object of this invention is to provide economical and high-performance banks of interconnected photovoltaic cells having special application in the production of electricity from solar energy.

These and other objects and advantages of this invention will be apparent from the following description.

DETAILED DESCRIPTION OF THE INVENTION

It has now been discovered that photovoltaic cells with silver or silver alloy thick film electrode or soldering pad coatings can be interconnected using tin/silver solders in a way that results in surprisingly superior thermal aging properties. The solders that are useful in this invention are combinations of tin and silver ranging from about 96% tin/4% silver to about 98% tin/2% silver applied to the silver thick films in the form of a solder paste incorporating compatible, volatile fluxing agents.

Solder pastes comprising relatively large amounts of tin and relatively small amounts of silver are well-known in the art and are commercially available from several manufacturers. For example, "96 tin/4 silver Xersin 2005" is a solder paste comprising approximately 96% tin and 4% silver in a synthetic flux, manufactured by Multicore Corp. having U.S. offices in Westbury, New York. In general, the solder pastes useful in conjunction with this invention are homogeneous stable blends of pre-alloyed solder powder and flux. They usually incorporate a special flux or gelling additive to prevent the solder powder from settling.

The solder pastes used in practicing this invention have a creamy, paste-like consistency and are available ready for use in a wide range of combinations of solder alloy, flux, particle shape, particle size, flux content and viscosity. The literature in the field notes that these solder pastes are increasingly finding applications in soldering of surface mounted devices to hybrid circuits and printed circuit boards. A Multicore Corp. product bulletin entitled "Solder Cream", in describing its line of solder pastes, indicates that a 96.3 Sn/3.7 Ag solder paste has particular application where higher melting point lead-free joints are required There appears to be no recognition in the literature, however, of the special utility of such solder pastes in connecting conductors to contacts or soldering pads of photovoltaic cells that are in the form of silver or silver alloy thick films.

The literature in the field also recognizes a variety of natural and synthetic fluxing agents that are compatible with the solder pastes and designed to keep the solder powder in suspension. The Multicore Corp. product bulletin referred to above, for example, lists eleven types of fluxing agents that can be used to formulate its solder pastes. A synthetic flux sold under the trade name "Xersin 2005", recommended in the Multicore Corp. bulletin for very high reliability applications, and a mildly activated rosin flux (RMA), recommended for military and professional electronics applications, have been found to demonstrate superior thermal aging properties when used in accordance with this invention. Xersin has the advantage of leaving no corrosive residue behind after bonding, but it does not promote particularly good wetting of the silver by 96% Sn solder. On the other hand, the Multicore Corp. bulletin notes that RMA flux promotes excellent wetting, but contains some ionic ingredients which will remain behind on the cell. However, the choice of fluxing agent is not considered critical for this invention. Any recognized natural or synthetic fluxing agent compatible with a tin/silver solder paste is intended to be within the scope of this invention.

For a better understanding of the present invention, the following examples are presented. These examples are intended only as representative embodiments of this invention and should in no way be construed as limiting the field or scope of this invention.

EXAMPLE 1

Photovoltaic silicon cells were provided that had a rear contact comprising an aluminum layer covering the silicon substrate, with the aluminum layer having windows that were filled with silver/glass solder pads in direct contact with the underlying silicon. The solar cells also had a silicon nitride anti-reflection (AR) coating on their front surfaces, and a front grid-shaped contact comprising a silver/glass composition that penetrated the AR coating and was fused to the front surfaces so as to make an ohmic contact therewith. The silver soldering pads and the front grid-shaped silver contacts were thick films having a thickness of about 17-20 microns. The silver front grid contacts and the silver rear soldering pads of each cell were electrically interconnected to other like cells with copper ribbon using "96 tin/4 silver Xersin 2005" solder paste manufactured by Multicore Corp, so as to form multi-cell modules. The solder paste was deposited at ambient temperature, i.e., 25 degrees C, on each silver thick film using a syringe as a paste dispenser It is to be noted that in commercial production, the solder paste would be deposited on the cells mechanically using automated dispensers such as the "CAM/ALOT" dispensing system manufactured by Camelot Systems, Inc. located in Haverhill, Massachusetts. To effect soldering, the paste was then heated in situ by the use of resistance heating electrodes or jets of hot air. During the heating process, the "Xersin 2005" fluxing agent, which is believed to be primarily pentaerythritoltetrabenzoate ("Pentoate"), was driven off and the metallic components of the solder were fused to the silver films and the copper conductors. Multi-cell modules prepared in the manner described above were used in the following test comparisons.

EXAMPLE 2

Modules comprising silver thick film photovoltaic cells prepared in the manner described in Example 1 were compared with similar modules prepared using conventional dip-soldering techniques and a solder bath comprising approximately 96% tin/4% silver. The initial bond strength at the cell contact points for modules prepared according to this invention (Example 1) averaged 1.68 lb., whereas the average bond strength for modules prepared using dip-soldering was only 0.48 lb. This example demonstrates that, even before being subjected to aging or additional thermal stress, photovoltaic cell modules prepared in accordance with this invention showed superior bonding strength at the electrical contact points to modules prepared using the same general solder composition applied by conventional dip-soldering.

EXAMPLE 3

In this example, the stability of modules prepared in the manner described in Example 1 were compared over time and at elevated temperatures with similar modules that had been prepared using (a) conventional dip-techniques and (b) a solder bath comprising approximately 96% tin/4% silver to interconnect the several cells making up the modules. Testing of the modules prepared according to Example 1 showed substantially no degradation of the solder bonds at the cell contact points after 45 minutes at 150° C.

With these encouraging results, the testing of the modules prepared according to Example 1 was extended at 150° C. to 63 hours This test would be equivalent to 30 years at projected operating conditions, if a standard (and simplistic) assumption were correct that the rate of degradation doubles for every 10° C. rise in temperature. The test showed no significant degradation occurring until near the end of the test period. At the end of the test, 100% of the bonds were still over 0.25 lb., with an average of 0.70 lb. When the test period was more than doubled to 135 hours, 89% of the bonds still passed our criterion for initial peel strength.

By contrast, when modules prepared using the conventional dip-soldering techniques and a 96% tin/4% silver solder bath were subjected to the same test, bond yield was stable at the beginning of the test, but dropped to only 3% after 16 hours at 150° C. This example demonstrates the surprising and completely unexpected superior thermal stability of photovoltaic cell modules prepared in accordance with this invention compared to prior art modules.

Based on these and other tests, we conclude that photovoltaic cell modules prepared using the solder paste compositions of this invention will maintain their bond strength at a temperature of about 150° C. as much as 200 times longer than modules prepared using conventional dip-soldering techniques and solder baths comprising approximately 96% tin/4% silver.

We have also explored the range of compositions providing best maintenance of bond strength in this application, and have found it to be relatively narrow. Based on these observations, we believe that optimum performance will be found for solder compositions between 96% tin/4% silver and 98% tin/2% silver.

As used herein, the term "silver contact(s)" means and includes an entire electrode or electrodes on the rear and front sides of a solar cell, and also those members which function as soldering pads for contacts made of another metal. Thus, for example, the term "silver contact(s)" includes a silver/glass frit grid-shaped front contact and the silver soldering pads that are associated with and fill the windows of an aluminum rear solar cell contact. Also the terms "silver film" and "silver coating" mean a film or coating that consists entirely or primarily of silver. Those terms are to be construed to embrace a film that is characterized by 90-100 wt. % silver and 0-10 wt. % aluminum and/or nickel.

It should be understood that the foregoing description of the invention is intended merely to be illustrative and that the other embodiments and modifications may be apparent to those skilled in the art without departing from its spirit.

What we claim is:

1. Apparatus comprising in combination: a photovoltaic cell comprising a silicon substrate having front and rear surfaces and electrically-conducting thick film silver contacts on said front and rear surfaces, a wire means, and a tin and silver solder bonding said wire means to at least one of said silver contacts, said solder comprising between about 96% tin/4% silver to about 98% tin/2% silver, wherein said solder was in the form of a paste when it was used to bond said wire means to said at least one silver contact.

2. Apparatus according to claim 1 wherein said solder paste comprised a compatible fluxing agent.

3. A photovoltaic cell comprising a silicon substrate, at least one electrical contact comprising silver, and a wire bonded to said contact with a solder paste comprising about 96% tin/4% silver to about 98% tin/2% silver.

4. The photovoltaic cell of claim 3 wherein said contact comprises a glass frit.

5. The photovoltaic cell of claim 3 wherein said solder was in the form of a paste comprising a fluxing agent when it was used to bond said wire to said electrical contact.

6. A plurality of silicon photovoltaic cells electrically connected by wire means bonded to thick film silver contact on said cells, characterized by the use of a tin and silver solder paste to bond said wire means to said contact points.

7. The cells of claim 6 wherein said solder paste comprises between about 96% tin/4% silver to about 98% tin/2% silver.

8. A photovoltaic silicon cell prepared by the process of:
   (a) coating a part of a silicon substrate with a silver-rich film to form at least one electrical contact;
   (b) applying a tin and silver solder paste to said at least one electrical contact at ambient temperature;

(c) contacting said solder paste with an electrically conducting wire; and (d) heating said solder paste at a temperature and for a time sufficient to cause the tin and silver components of said solder paste to form a bond between said wire and said electrical contact point.

9. The apparatus of claim 8 wherein said solder paste comprises about 96% tin/4% silver to about 98% tin/2% silver.

10. The apparatus of claim 9 wherein said solder paste further comprises a compatible fluxing agent.

11. A method of preparing silicon photovoltaic cells with improved thermal stability, comprising the steps of:

(a) coating at least one surface of the silicon substrates of said cells with a silver film so as to form at least one silver-containing electrical contact on each substrate;

(b) applying a tin and silver solder paste to said at least one silver-containing electrical contact at ambient temperature; and (c) physically contacting said solder paste at said at least one silver-containing electrical contact with an electrically conducting wire while heating said solder so as to cause the tin and silver components of said paste to form a bond between said wire and said electrical contact.

12. The apparatus of claim 11 wherein said solder paste comprises about 96% tin/4% silver to about 98% tin/2% silver.

13. The apparatus of claim 12 wherein said solder paste further comprises a compatible fluxing agent.

* * * * *

UNITED STATES PATENT AND TRADEMARK OFFICE
CERTIFICATE OF CORRECTION

PATENT NO. : 5,074,920

DATED : December 24, 1991

INVENTOR(S) : Ronald C. Gonsiorawski et al

It is certified that error appears in the above-identified patent and that said Letters Patent is hereby corrected as shown below:

Claim 6, column 6, line 57, "contact" should be -- contacts --.

Signed and Sealed this

Thirtieth Day of March, 1993

*Attest:*

STEPHEN G. KUNIN

*Attesting Officer*     *Acting Commissioner of Patents and Trademarks*